United States Patent [19]

Morimoto et al.

[11] 4,394,210

[45] Jul. 19, 1983

[54] PROCESS FOR FORMING A LEAD FILM

[75] Inventors: Kiyoshi Morimoto, Mobara; Toshinori Takagi, Nagaokakyo, both of Japan

[73] Assignee: Futaba Denshi Kogyo K.K., Chiba, Japan

[21] Appl. No.: 248,212

[22] Filed: Mar. 27, 1981

[30] Foreign Application Priority Data

Mar. 31, 1980 [JP] Japan ................................. 55-40441

[51] Int. Cl.³ ............................................. C30B 23/08
[52] U.S. Cl. .......................... 156/608; 156/DIG. 85; 156/DIG. 103; 156/DIG. 102; 427/38; 427/42; 427/45.1; 427/62; 427/99; 427/250; 427/252
[58] Field of Search ......................... 427/34, 42, 62, 63, 427/126.5, 45.1, 38, 250, 252, 294, 99; 250/425; 156/608, 610, DIG. 102, DIG. 103, DIG. 85

[56] References Cited

U.S. PATENT DOCUMENTS

| | | | |
|---|---|---|---|
| 3,816,173 | 6/1974 | Eldridge et al. | 427/62 |
| 4,091,138 | 5/1978 | Takagi et al. | 427/81 X |
| 4,098,919 | 7/1978 | Morimoto et al. | 427/42 |
| 4,152,478 | 5/1979 | Takagi | 427/38 X |
| 4,227,961 | 10/1980 | Takagi | 156/608 |

FOREIGN PATENT DOCUMENTS

| | | | |
|---|---|---|---|
| 52-35775 | 3/1977 | Japan | 427/38 |
| 52-63125 | 5/1977 | Japan | 427/38 |

OTHER PUBLICATIONS

IBM J. Res. Develop., vol. 24, No. 2, "Fabrication Process for Josephson Integrated Circuits", (Mar. 1980).

*Primary Examiner*—Norman Morgenstern
*Assistant Examiner*—Thurman K. Page
*Attorney, Agent, or Firm*—Oblon, Fisher, Spivak, McClelland & Maier

[57] ABSTRACT

There is disclosed a process for forming a lead film by a cluster ion beam deposition which includes the step of impinging ionized and non-ionized neutral clusters having 100 to 2,000 atoms of vapor of lead loosely coupled by Van der Walls force upon a substrate within a vacuum chamber which is kept at about $10^{-2}$ Torr or less thereby forming the lead film thereon.

5 Claims, 7 Drawing Figures

(x1000)

(x1000)

PROCESS FOR FORMING A LEAD FILM

BACKGROUND OF THE INVENTION

1. Field of the Invention

This invention relates to a process for forming a lead film which is chemically stable, stronger in adhesion strength with respect to a substrate, and high in packing density.

2. Description of the Prior Art

Lead is an important material in a field of electrochemistry and is advantageously used in electrodes in industrial electrolyses and lead-batteries. It is also used for radiation shielding materials, solder materials and overcoat alloy for cables, because of its larger atomic number and high density. Furthermore, it is an important material adapted for use in superconducting elements, such as, for example, Josephson element, because it exhibits superconductivity under an ultra low temperature of less than 7° K.

When applying lead as a material for fabricating the superconducting element, it is necessary to form a thin lead film. In the prior arts, such a thin lead film is only produced by vacuum evaporation. However, the thin lead film formed by the vacuum evaporation has smaller density as compared with a solid-state lead, and is easily oxidized and bonded to $O_2$ if it is exposed in air after the formation of the film, and then it is converted into chemically unstable PbO or $PbO_2$. Furthermore, the thin lead film produced by the vacuum evaporation has such a mechanical defect that adhesion strength with respect to a substrate is not strong enough, which causes the lead film to easily peel off from the substrate. Moreover, it is difficult to control the film thickness and crystal orientation axis when forming the thin lead film. In view of these disadvantages and others, the thin lead film produced by the conventional vacuum evaporation is not adapted for use in the superconducting element. In the superconducting element, it is important not to cause the lead film to peel off due to a temperature cycle between ultra low and room temperatures which the superconducting element undergoes.

In addition, the lead film has tremendous utility in the field of electrochemistry. For instance, if electrodes of various batteries could be made of the thin lead film, it is possible to make various apparatuses using the battery smaller in size and light in weight and to save the materials for producing these apparatuses. However, the production of such an apparatus has not yet been successful, because of the defects inherent in the thin lead film formed by the vacuum evaporation.

SUMMARY OF THE INVENTION

In the light of the foregoing circumstances, the inventors have conducted extensive research and experiments to produce a lead film which is chemically stable and has a mechanical strength, and finally accomplished this invention based on findings that the lead film which is chemically and mechanically stable can be produced by a cluster ion beam deposition process.

Accordingly, it is an object of the present invention to provide a process for forming a lead film which has a strong adhesion force with respect to a substrate to thereby increase its mechanical strength.

It is still another object of the present invention to provide a process for forming a lead film which has a large packing density with the consequent result that it is chemically stable and is not easily oxidized in air.

It is a further object of the present invention to provide a process for forming a lead film which can be applied to electronics elements, electro-chemical appliances, radioactive appliances and the like, and permits these appliances to be made compact in size and light in weight.

It is still a further object of the present invention to provide a process for forming a lead film which is capable of controlling its film thickness and the direction of orientation of the crystal axis by changing the conditions for forming the lead film.

Briefly, the foregoing and other object are attained by providing a process for forming a lead film which includes the steps of heating and vaporizing lead in a closed type crucible with at least one injection nozzle to form lead vapor, ejecting the lead vapor through the injection nozzle into a high vacuum region the pressure of which is kept at about $10^{-2}$ Torr or less to adiabatically expand the lead vapor so as to attain a supercooled state and form clusters including atoms of the lead vapor, ionizing at least a part of the clusters by bombarding the clusters with electrons to produce ionized and non-ionized neutral clusters, and permitting the ionized and non-ionized neutral clusters to collide with a substrate with kinetic energy imparted to the clusters at the time of the ejection from the nozzle. According to the cluster ion beam deposition process for forming the lead film of the present invention, it is possible to fabricate the lead film which is mechanically stronger and chemically stable due to the specific effects of the cluster ion beam deposition, such as, for example, ionization effect created by the electric field of the ionized lead atoms, sputtering and cleaning effects exerted on the substrate, heating effect due to the conversion of kinetic energy of the lead particles into thermal energy when these particles are impinged upon the substrate, and the like.

BRIEF DESCRIPTION OF THE DRAWINGS

The exact nature of this invention, as well as other objects and advantages thereof, will be readily apparent from the following specification relating to the annexed drawings in which.

DESCRIPTION OF THE PREFERRED EMBODIMENTS

A process for forming a lead film according to an embodiment of the present invention will now be described in connection with the accompanying drawings. First, reference will be made to a cluster ion beam deposition process.

The cluster ion beam deposition process includes the steps of heating and vaporizing a component element for forming a film in a closed type crucible with at least one injection nozzle to form vapor of the component element, ejecting the vapor through the injection nozzle into a high vacuum region the pressure of which is kept at 1/100 or less of the vapor pressure in the crucible to adiabatically expand the vapor at the time of the ejection from the nozzle so as to attain a supercooled state and form aggregates or clusters comprising 100 to 2,000 atoms of the vapor loosely coupled by Van del Waals force, ionizing at least a part of the clusters by bombarding the clusters with electrons to produce ionized and non-ionized neutral clusters, accelerating the ionized clusters by means of an electric field if necessary, and permitting the ionized and non-ionized neutral clusters to collide with a substrate with kinetic energy imparted to the clusters at the time of the ejection from the nozzle thereby forming a film consisting of the component element deposited thereon.

In the cluster ion beam deposition, the kinetic energy forces the ionized and non-ionized clusters to impinge upon the substrate and produces sputtering, cleaning and/or ion injection effects with respect to the substrate which increase adhesion strength of the deposited film. Furthermore, the kinetic energy is partially converted into thermal energy when these clusters impinge upon the substrate, to thereby achieve chemical activation of the deposited film. When the ionized and non-ionized clusters come into collision with the substrate, each cluster is disintegrated into individual atomic particles which move on the surface of the substrate and form a crystallographically superior film due to migration effects. Since the clusters are partially ionized, the atomic particles migrating on the surface of the substrate are chemically activated, which results in an increase in bond strength between the atoms and improvement in mechanical flatness of the resultant film surface. In the cluster ion beam deposition, the sputtering, ion injection, migration and various other effects can be controlled by changing substrate temperature, vacuum degree in the environmental space of the crucible, ionization rate of the clusters, and acceleration voltage for the ionized clusters so that the film to be grown on the substrate may be in an amorphous, polycrystalline, or single crystalline state. Moreover, preferential orientation of the crystal axis can be regulated.

Figure 1:
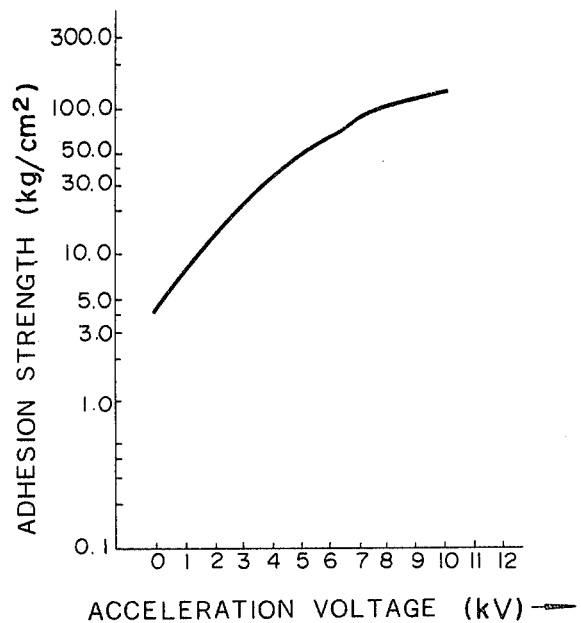
FIG. 1 is a graph of the adhesion strength as a function of applied acceleration voltage for a film formed by the process of the present invention.
Figure 2:
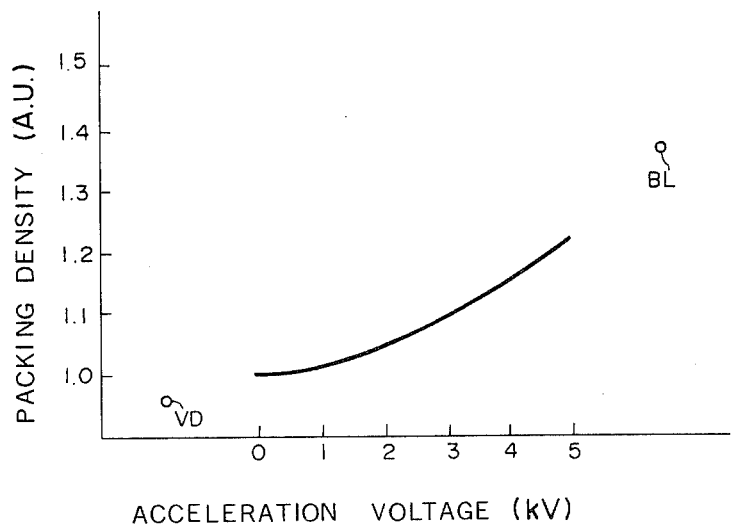
FIG. 2 is a graph of the packing density as a function of applied acceleration voltage for a film formed by the process of the present invention.

For instance, the adhesion strength of the film with respect to the substrate and the packing density can be controlled by changing the acceleration voltage. In FIG. 1, there is shown variation of the adhesion strength as a function of the applied acceleration voltage for a lead film deposited on a glass substrate by the cluster ion beam deposition. As is apparent from FIG. 1, the adhesion strength can be significantly improved by changing the acceleration voltage from 0 to 10 KV. FIG. 2 is a graph showing how the packing density is influenced by the applied acceleration voltage when gold is deposited on a lead substrate by the cluster ion beam deposition. In FIG. 2, there is shown variation of the packing density of the film according to the cluster ion beam deposition in comparison with packing densities of a film produced by the ordinary vacuum deposition which is shown by the reference numeral VD and a solid-state gold which is shown by the reference numeral BL. As is apparent from FIG. 2, the packing density of the film formed by the cluster ion beam deposition is higher than that of the film formed by the vacuum evaporation even if the acceleration voltage is 0 V. As the acceleration voltage increases, the packing density is improved so that it may approach to the packing density of the solid-state gold. As explained hereinabove, in the cluster ion beam deposition, the property of the film can be controlled by changing the conditions for forming the film. This invention is directed to a process for forming a high quality lead film which is chemically and mechanically stable using the cluster ion beam deposition explained hereinabove.

Figure 3:
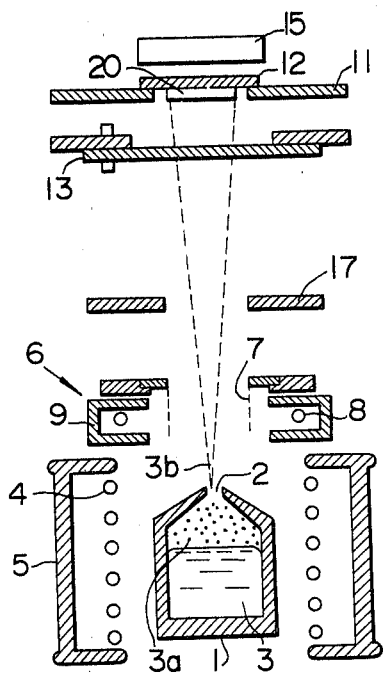
FIG. 3 is a schematical diagram of an apparatus for use in forming a lead film according to an embodiment of the present invention.

The process for forming the lead film according to the present invention is conducted by using an apparatus shown in FIG. 3.

The apparatus shown in FIG. 3 includes a closed type crucible 1 having at least one nozzle 2, which in this example is between 0.5 mm and 2.0 mm in diameter. The thickness of the nozzle 2 in the axial direction is as small as possible, preferably thinner than the diameter of the nozzle 2 so that the aspect ratio becomes less than 1. The crucible 1 contains lead powders or processed metal lead 3 of any suitable shape, which are introduced into the crucible.

The crucible is surrounded by a heater 4. In the embodiment shown in FIG. 3, the heater 4 operates by electron bombardment, and includes a coiled filament for emitting electrons. The crucible 1 is maintained at a positive potential relative to the filament, by means of a power source (not shown), thereby acclerating the electrons emitted from the filament so that they impinge upon the crucible surface at high velocity, to produce heating of the crucible 1. A thermal shielding plate 5 surrounds the heater 4. In a possible alternative arrangement for heating the crucible 1, the crucible is made of an electrically conductive material, terminals are provided on upper and lower parts of the crucible 1, and the crucible 1 is then heated by passing a high current (at low voltage) through the crucible 1 so as to heat the entire crucible 1. As a further alternative, the crucible 1 can be heated by radiation heating, with a heater disposed around the crucible 1. A combination of more than one of these heating methods may be used.

An ionization chamber 6 is provided above the crucible 1. Around the ionization chamber, there is provided an arrangement for generating ionizing electrons including a filament 8 enclosed within a shield 9, and a reticular anode 7 forming the outer limits of the ionization chamber. In plan view, the anode 7 is circular, although it may have any of a variety of other shapes, such as polygons.

A holder 11 is provided to hold a substrate 12 on which a lead film 20 is deposited. The holder 11 may be made of metal, semiconductor, glass, ceramic or sapphire. Also, a shutter 3 is provided to allow the substrate 12 to be shielded from the jets of lead. An annular acceleration electrode 17 to which a negative potential relative to the crucible 1 is applied by a power source (not shown) for accelerating ionized lead vapor may be provided between the ionization chamber 6 and the substrate 12. Also, a heater or cooler 15 may be provided to maintain the substrate 12 at the correct temperature, if required.

The apparatus shown in FIG. 3 is all enclosed in a vacuum chamber (not shown), together with the substrate 12 on which the lead film 20 is to be formed and the chamber is evacuated at a high vacuum state in the order of at least $10^{-5}$ Torr.

Reference will now be made to the process for forming the lead film of the present invention using the apparatus shown in FIG. 3.

When forming the lead film of the present invention, the metal lead 3 of any suitable shape is introduced into the crucible 1 and the vacuum chamber containing all of the apparatuses shown in FIG. 3 is evacuated at about $10^{-5}$ Torr or less. Then, the heater 4 is actuated to heat the crucible 1 for melting the metal lead 3 filled within the crucible 1 and generating vapor 3a of lead within the crucible 1. The temperature for heating lead is determined based on environmental space around the crucible 1, namely, the pressure within the vacuum chamber which can be expressed as $P/Po \geqq 10^{-2}$, preferably $P/Po \geqq 10^{-4}$, in which P represents the vapor pressure of lead within the crucible 1 and Po represents the pressure within the vacuum vessel. The vapor pressure of lead is low in spite of the relatively lower melting point of 328° C. Accordingly, it must be heated at a high temperature in order to increase the pressure of the lead vapor 3a within the crucible 1. For instance, since the vapor pressure of lead at the temperature of 840° C. is approximately $10^{-1}$ Torr, the crucible must be heated up to 900° C. to maintain the inside of the crucible at the temperature of 840° C. The heating temperature may be increased within the extent of not damaging quality of the lead film to be formed so that the vapor pressure P may be increased to enhance the speed of the film formation.

Heating temperature of the substrate 12 is determined depending upon properties required in the lead film. For instance, when crystal orientation is required in the film, a higher temperature is preferable, while a relatively lower temperature is suitable for improving flatness of the film surface. The substrate temperature for obtaining the flat film surface must be at least less than the melting point of lead. The lower the substrate temperature, the better the flatness of the film. In a superconducting element requiring a particularly smooth film surface, it is effective to maintain the substrate temperature below 50° C. so as to improve the flatness of the film. Under certain circumstances, it is preferable to cool the substrate below 0° C.

The lead vapor 3a is ejected from the nozzle 2 to the outside of the crucible 1 due to the pressure difference between the crucible 1 and the vacuum vessel. The ejected vapor is imparted with kinetic energy corresponding to the ejection velocity and directed toward the substrate 12 in the form of vapor stream 3b. In this instance, if the vapor is forced into a supercooled state due to the adiabatic expansion at the time of ejecting from the nozzle 2 by changing the shape of the nozzle 2 and the pressures P and Po so as to meet the conditions explained hereinabove, or modifying the shape of the nozzle 2 of the crucible 1, it is possible to have a part of the lead in the vapor stream 3b converted into clusters which are large aggregates of the vapor of lead atoms or molecules loosely coupled by Van der Waals force.

The vapor stream 3b imparted with the kinetic energy due to the ejection from the crucible 1 is passed through the ionization chamber 6 where at least a part of the vapor stream 3b is ionized. The ionization of the vapor stream 3b is effected in such a manner that electrons emitted from the filament 8 when energized and heated are accelerated at the voltage of 100–1,000 V which is applied between the filament 8 and the reticular anode 7 and then impinged upon the vapor stream 3b passing through the reticular anode 7. When the vapor stream 3b of lead spouted from the nozzle 2 is in the form of the clusters, at least one of the atom groups consisting of each cluster is ionized in the ionization chamber 6 by the electron bombardment, thereby forming cluster ions.

The ionized lead atoms and the non-ionized neutral lead atoms or the lead clusters and the cluster ions are directed toward the substrate 12, and, when the shutter 13 is open, the vapor stream 3b is brought into collision with the surface of the substrate 12 to form the lead film 20 thereon. The lead film thus formed is strongly adhered to the substrate, because the substrate surface is sputtered and etched due to the kinetic energy of lead impinging upon the substrate 12 in addition to the ion injection effect. The non-ionized neutral clusters and cluster ions impinged upon the substrate 12 are disintegrated into individual atomic particles immediately upon the collision with the substrate 12 and move on the surface of the substrate 12 together with the lead atoms directly striking the substrate 12 to facilitate the growth of the film formation due to the migration effects.

The electric field of the partially ionized particles is effectively acted upon during the initial stage of the film formation. That is, the electric field of the ions promotes the formation of nuclei for the crystal growth and promotes the formation of island regions gathering the atoms at the center of the nuclei thus formed which is generally known as a coalescence. Accordingly, the lead film 20 thus formed consists of an agglomeration of the lead atoms with remarkably improved packing density. It is to be understood that the increase in the adhesion strength and the improvement in the packing density can be attained by applying the acceleration voltage to the acceleration electrode 17 in the same manner as the examples explained in connection with FIGS. 1 and 2. Furthermore, the thickness of the lead film 20 to be formed can be controlled at will by changing the heating temperature of the crucible 1 and the acceleration voltage. In addition, the application of the acceleration voltage enables one to provide the lead film with preferential orientation.

Figure 4:
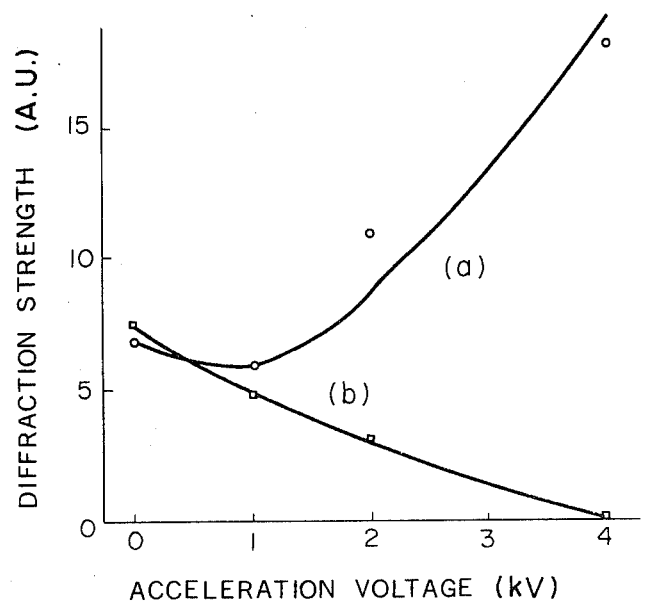
FIG. 4 is a graph of the diffraction strength as a function of the applied acceleration voltage for a lead film formed by the process of the present invention.

FIG. 4 is a graph showing the dependency of the orientation upon the acceleration voltage for the lead film 20 deposited on a glass substrate by using the apparatus shown in FIG. 3 in accordance with the process of the present invention. In FIG. 4, there is shown an X-ray diffraction pattern as a function of applied acceleration voltage for the lead film 20 which is formed by evacuating the environmental space around the crucible 1 is a high vacuum atmosphere of $10^{-5}$ Torr, maintaining the ionization current emitted from the filament at 100 mA and keeping the substrate temperature at 10° C. The lead film 20 thus formed is orientated to the (111) and (200) planes. However, diffraction strength on the (111) plane becomes predominant as the acceleration voltage increases as shown in the curve (a) of FIG. 4. The curve (b) of FIG. 4 shows the ratio of the diffraction strength on the (200) plane to (111) plane namely, (200)/(111). As is apparent from curves (a) and (b), the (111) plane is preferentially orientated as the acceleration voltage increases, and the lead film 20 can be provided with the preferential orientation by the application of the acceleration voltage.

As explained hereinabove, in the process for forming the lead film 20 according to the present invention, the lead film which is stronger in adhesion strength with respect to the substrate and high in packing density can be formed due to the specific effects inherent in the cluster ion beam deposition. The lead film of the present invention has the packing density which is close to that of the solid-state lead. Accordingly, the lead film 20 thus formed is hardly oxidized even if it is exposed in oxygen ($O_2$), and is adapted for use as a material for producing electrodes or superconducting elements.

The high packing density and the strong adhesion strength to the substrate in the lead film of the present invention can be appreciated by observing the surface of the lead film after a cyclic cooling test.

Figure 5:
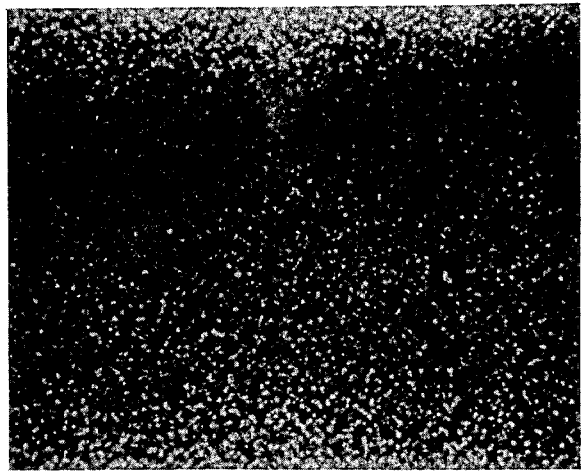
FIG. 5 is an electron micrograph showing the surface of a lead film of the present invention after subjecting the same to a cyclic cooling test.
Figure 6:
FIG. 6 is an electron micrograph showing the surface of a lead film produced by the conventional vacuum evaporation after subjecting the same to a cyclic cooling test.

FIG. 5 shows an electron micrograph of the surface of the lead film formed by the process of the present invention after it is subjected to a cyclic cooling test of eleven cycles between room temperature (300° K.) and the temperature of liquid nitrogen (77° K.). As shown in FIG. 5, the lead film does not peel off and maintains its initial state. To the contrary, a lead film formed by conventional vacuum evaporation peels off partially when it is subjected to the same cyclic cooling test as shown in FIG. 6. The high packing density and the strong adhesion strength to the substrate in the lead film formed by the process of the present invention can be understood by comparing two electron micrographs showing the condition of the surface.

Figure 7:
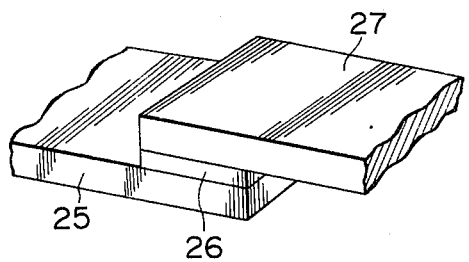
FIG. 7 is a schematical illustration of an element to which a lead film of the present invention is applied, by way of example.

As explained hereinabove, in the present invention, it is possible to form a lead film having strong adhesion force with respect to the substrate and high packing density. In addition, it is possible to control the adhesion strength, packing density, thickness of the lead film to be formed, and orientation of the crystal axis by changing the conditions for forming the lead film. Accordingly, various lead films having different characteristics can be formed depending upon the applied purpose of the lead film. For instance, the lead film formed by the process of the present invention is applicable to a tunnel junction type Josephson element so as to reduce the size of electronic appliances, such as, for example, computers, and is schematically illustrated in FIG. 7. When fabricating the Josephson element which includes a superconducting film 25, an oxidized film 26 and a superconducting film 27 using the lead film according to the process of the present invention, the superconducting film 25 having a high packing density is prepared by applying a high acceleration voltage. The oxidized film 26 (PbO or $PbO_2$) is made of an extremely thin lead film the thickness of which is approximately 10°A, for example, and formed on the superconducting film by setting the accelerating voltage at 0 V or applying a low acceleration voltage. The lead film thus formed is low in packing density because of the application of the low acceleration voltage, and is immediately oxidized when it is exposed in an oxygen ($O_2$) atmosphere. The formation of the oxidized film 26 may be effected by a reactive cluster ion beam deposition which forms the lead film in the oxygen ($O_2$) atmosphere. The superconducting film 27 is made of a lead film having a high packing density which is deposited on the oxidized film 26 in a high vacuum atmosphere by applying a high acceleration voltage in the same manner as the formation of the superconducting film 25. In the process of the present invention, the superconducting element can be fabricated by a continuous manufacturing process.

As explained hereinabove, the present invention is directed to the process for forming the lead film by cluster ion beam deposition. Accordingly, the lead film to be formed is stronger in adhesion strength with respect to the substrate and increases the mechanical strength due to the specific effects inherent in the cluster ion beam deposition. Furthermore, the lead film is not easily oxidized in air and is chemically stable, because it is high in packing density. Therefore, it can be adapted for use in various fields, for instance, in a superconducting element to which the lead film formed by the conventional vacuum evaporation is heretofore impossible to apply. Moreover, the characteristics of the lead film can be controlled by changing the conditions for forming the lead film, such as, for example, the substrate temperature, the ionization rate of the clusters, and the acceleration voltage of cluster ions. Thus, a variety of the lead films can be formed depending upon the applied purpose of the lead film. In the process for forming the lead film according to the present invention, it is possible to form the high quality thin lead film which is heretofore difficult to produce. Thus, various electro-chemical appliances and radioactive appliances which are compact in size and light in weight or a novel electronics element can be fabricated by using the lead film formed by the process of the present invention.

Obviously, numerous modifications and variations of the present invention are possible in light of the above teachings. It is therefore to be understood that within the scope of the appended claims, the invention may be practiced otherwise than as specifically described.

What is claimed as new and desired to be secured by Letters Patent of the United States is:

1. A process for forming a lead film including a closed type crucible having at least one injection nozzle, means for heating and vaporizing lead, an ionization chamber, an acceleration electrode having an acceleration voltage, a shutter, a substrate, temperature control means for controlling the temperature of said substrate, and a vacuum chamber surrounding said crucible, said heating and vaporizing means, said ionization chamber, said acceleration electrode, said shutter, said substrate, and said temperature control means, wherein said process comprises:

heating and vaporizing said lead in said crucible to form a pressurized lead vapor;

injecting said lead vapor through said at least one injection nozzle into said vacuum chamber;

maintaining a pressure differential between said vacuum chamber and said lead vapor in said crucible at a ratio of less than or equal to $10^{-2}$;

using said pressure differential to form a vapor stream of said lead;

generating electron beams within said ionization chamber;

directing said electron beams through said vapor stream so as to form an ionized portion of said vapor stream;

accelerating said ionized portion of said vapor stream toward said substrate with said acceleration electrode;

impinging said vapor stream upon said substrate such that said lead film is deposited thereon;

using said shutter for selectively shielding said substrate from the flow of said vapor stream;

controlling the packing density of said lead film by regulating said acceleration voltage; and controlling the surface flatness of said lead film by regulating said temperature control means such that the temperature of said substrate is maintained below the melting point of lead.

2. The process of claim 1 which further comprises controlling the orientation of the crystal axis of said lead film by regulating said acceleration voltage.

3. The process of claim 1 which further comprises controlling the flatness of said lead film by regulating said heating means.

4. The process of claim 1 which further comprises:
   forming large aggregates of lead atoms within said vapor stream; and
   controlling the formation of said large aggregates by modifying the shape of said injection nozzle.

5. The process of claim 1 which further comprises maintaining the temperature of said substrate below 50° C.

* * * * *